(12) United States Patent
Andersson et al.

(10) Patent No.: US 6,445,305 B2
(45) Date of Patent: Sep. 3, 2002

(54) CMOS LOW BATTERY VOLTAGE DETECTOR

(75) Inventors: Olle Andersson, Järfälla; Tony Ohlsson, Johanneshou, both of (SE)

(73) Assignee: Mitel Semiconductor AB, Jarfalla (SE)

( * ) Notice: Subject to any disclaimer, the term of this patent is extended or adjusted under 35 U.S.C. 154(b) by 0 days.

(21) Appl. No.: 09/773,655

(22) Filed: Feb. 1, 2001

(30) Foreign Application Priority Data

Feb. 9, 2000 (GB) .............................................. 0002830

(51) Int. Cl.⁷ .............................................. G08B 21/00
(52) U.S. Cl. ...................... 340/636; 340/635; 340/663
(58) Field of Search ................................ 340/636, 635, 340/663; 323/299, 267, 271, 349, 354; 320/107, 132, 136; 307/16

(56) References Cited

U.S. PATENT DOCUMENTS

| | | | |
|---|---|---|---|
| 4,375,595 A | | 3/1983 | Ulmer et al. |
| 4,701,639 A | * | 10/1987 | Stanojevic .................. 307/350 |
| 4,868,908 A | | 9/1989 | Pless et al. |
| 4,952,864 A | * | 8/1990 | Pless et al. .................. 340/636 |
| 5,196,833 A | | 3/1993 | Kemp |
| 5,563,504 A | | 10/1996 | Gilbert et al. |
| 5,796,239 A | * | 8/1998 | Duong et al. ................ 320/107 |
| 5,814,995 A | | 9/1998 | Tasdighi |
| 5,828,209 A | * | 10/1998 | Janssen ....................... 323/352 |
| 5,965,997 A | * | 10/1999 | Alwardi et al. .............. 320/132 |

* cited by examiner

Primary Examiner—Van Trieu
(74) Attorney, Agent, or Firm—Lawrence E. Laubscher, Jr.

(57) ABSTRACT

A system and method for detecting a low battery voltage supplied to a battery operated integrated circuit. A stable reference voltage provided by a bangap reference is compared with the battery voltage. A switched capacitor circuit is used instead of the more conventional resistor combination to supply a scaled representation of the battery voltage. Power requirements are reduced by combining the bandgap reference and the comparator into a single component.

14 Claims, 3 Drawing Sheets

CMOS LOW BATTERY VOLTAGE DETECTOR

FIELD OF THE INVENTION

This invention relates to battery operated circuits and, more particularly, to a method and system for detecting low battery voltage utilizing a stable reference voltage and a switched-capacitor circuit.

BACKGROUND OF THE INVENTION

In many battery operated applications, some means for detecting a low battery voltage is needed. In such applications, a warning signal might be generated or, alternatively, vulnerable circuits within a system might be selectively disabled by an appropriate control signal in order to avoid damage to or malfunction of such circuits. A straightforward method of implementing a low voltage detection function is to compare a scaled battery voltage and a stable reference voltage such as a voltage from a bandgap circuit. It is known, as will be discussed in greater detail later, that a bandgap circuit can generate a stable, substantially temperature independent reference voltage. Normal time-continuous bandgap references typically need well-matched resistors and transistors and some sort of trimming to get good accuracy.

U.S. Pat. No. 5,196,833, which issued Mar. 23, 1993, to Kemp describes a low voltage detection circuit which includes a bandgap reference and a differential comparator circuit for generating a signal proportional to the level of the supply voltage. Since many battery operated circuits are subject to ambient temperature variations, such as an automobile application as disclosed in the U.S. Pat. No. 5,196,833, it is important that some form of temperature compensation be used in deriving the reference voltage. The bandgap cell, as disclosed in the aforementioned patent, includes bipolar transistors in which the base to emitter voltage is used as a reference source. Typically, two transistors are used having different current densities through each. In the U.S. Pat. No. 5,196,833, the different current densities are achieved by using four parallel transistors in one current path and a single transistor in the second. It has been shown that the base to emitter voltage ($V_{BE}$) of a bipolar transistor exhibits a negative temperature coefficient with respect to temperature. On the other hand, it has also been shown that the difference of base to emitter voltages $\Delta V_{BE}$ of the two bipolar transistors operating at different current densities exhibit a positive temperature coefficient with respect to temperature. Thus, the sum of the base to emitter voltage $V_{BE}$ of a bipolar transistor and a differential voltage $\Delta V_{BE}$ will be relatively independent of temperature when the sum of the voltages equals the energy gap of silicon. Such temperature stable references have been created by generating a $V_{BE}$ and summing a $\Delta V_{BE}$ of such value that the sum substantially equals the bandgap voltage of 1.205V.

U.S. Pat. No. 5,814,995, which issued Sep. 29, 1998, to Tasdighi, discloses a voltage detector for a battery operated device employing two bipolar transistors and an operational amplifier as a comparator. The system of this reference also employs resistors which, as noted hereinbefore, must be well-matched and usually require some sort of trimming to obtain good accuracy.

U.S. Pat. No. 4,375,595, which issued Mar. 1, 1983, to Ulmer et al., relates to a temperature independent bandgap reference which employs switched capacitors to input the $V_{BE}$ and $\Delta V_{BE}$ of the bipolar transistors. A proper selection of the ratio of the switched capacitors is used to get around the need for matched and/or trimmed resistors. The switched capacitor implementation employs clock signals in order to establish a precharge phase and an output reference stage. In the U.S. Pat. No. 4,375,959, three separate clock signals are required.

U.S. Pat. No. 5,563,504, which issued Oct. 8, 1996, to Gilbert et al., also relates to a switching bandgap voltage reference in which one bipolar transistor is used with two different current sources providing the current densities needed to obtain the $\Delta V_{BE}$ value.

Thus, in an application where a battery voltage detector is required in order to detect a low voltage value, and providing that a suitable clock exists within the application, a switched capacitor architecture can provide an effective solution.

SUMMARY OF THE INVENTION

The present invention provides lower untrimmed errors by utilizing offset cancellation techniques. This, in combination with a switched capacitor network having well-matched capacitors provide suitable weighting factors.

The invention also provides for a reduced component count by combining a voltage reference circuit and a voltage comparator into a single circuit.

In a preferred embodiment, the comparator implementation eliminates the need to actually generate a 1.2V bandgap reference voltage.

The invention also provides for lower power requirements by eliminating part of the static current by replacing resistors in the bandgap circuit with a switched capacitor circuit.

Therefore, in accordance with a first aspect of the present invention there is provided a detector for providing a low battery voltage indication comprising: a stable voltage reference and comparator circuit for comparing the battery voltage and the voltage reference; switch means to switch between a first operational state and a second operational state; a switched capacitor circuit to store charges related to the battery voltage and the reference voltage in each operational state; and a clock to initiate switching between the first and second states, wherein an output from the comparator during the second state indicates whether the battery voltage is below a preset threshold.

In accordance with a second aspect of the present invention there is provided a method of detecting a low battery voltage supplied to an integrated circuit comprising: providing a stable voltage reference and comparator circuit for comparing battery voltage against the reference voltage; providing a capacitor circuit for storing charges associated with the battery voltage and the reference voltage; providing switching means to switch between a first phase wherein the capacitors are charged to a first voltage level, and a second phase wherein the capacitors are charged to a second level; and comparing the first and second levels to determine whether the battery voltage is above or below a preset threshold.

BRIEF DESCRIPTION OF THE DRAWINGS

The invention will now be described in greater detail with reference to the attached drawings wherein.

DETAILED DESCRIPTION OF THE INVENTION

Figure 1:
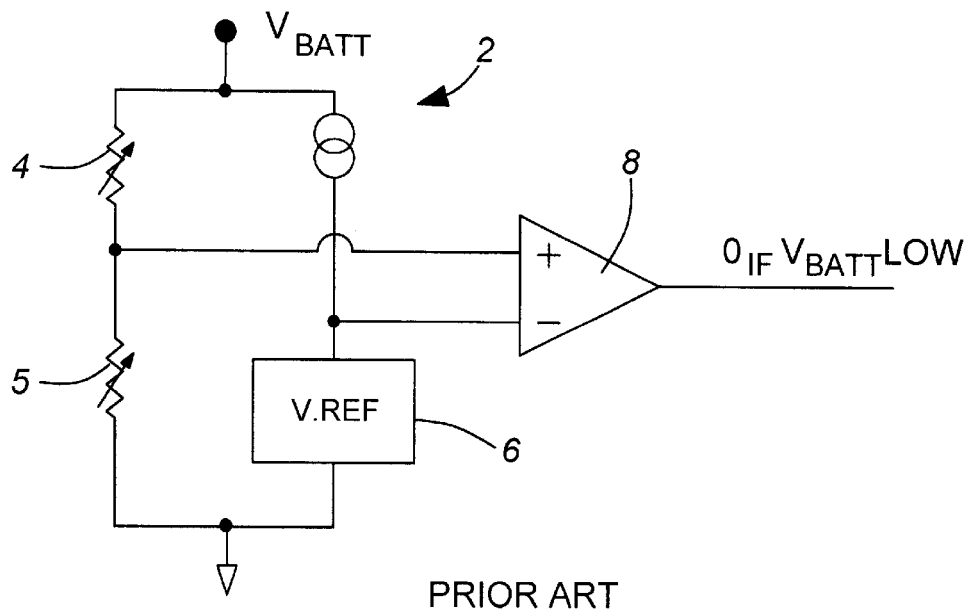
FIG. 1 illustrates a prior art voltage detector utilizing resistors.

FIG. 1 shows a basic, low battery voltage detector 2 according to the prior art. The scaled battery voltage taken across the voltage divider circuit comprising resistors 4 and 5 is supplied to the positive input of an operational amplifier 6 and the voltage reference 7 which in a preferred embodiment is a bandgap reference is supplied to the negative input of the operational amplifier 8. The output of the operational amplifier is 0 if the battery voltage is low and is a 1 otherwise.

A discussed previously, the voltage divider circuit comprising the resistors 4,5 increases the power requirement to the detector circuit and can lead to measurement inaccuracies.

Figure 2:
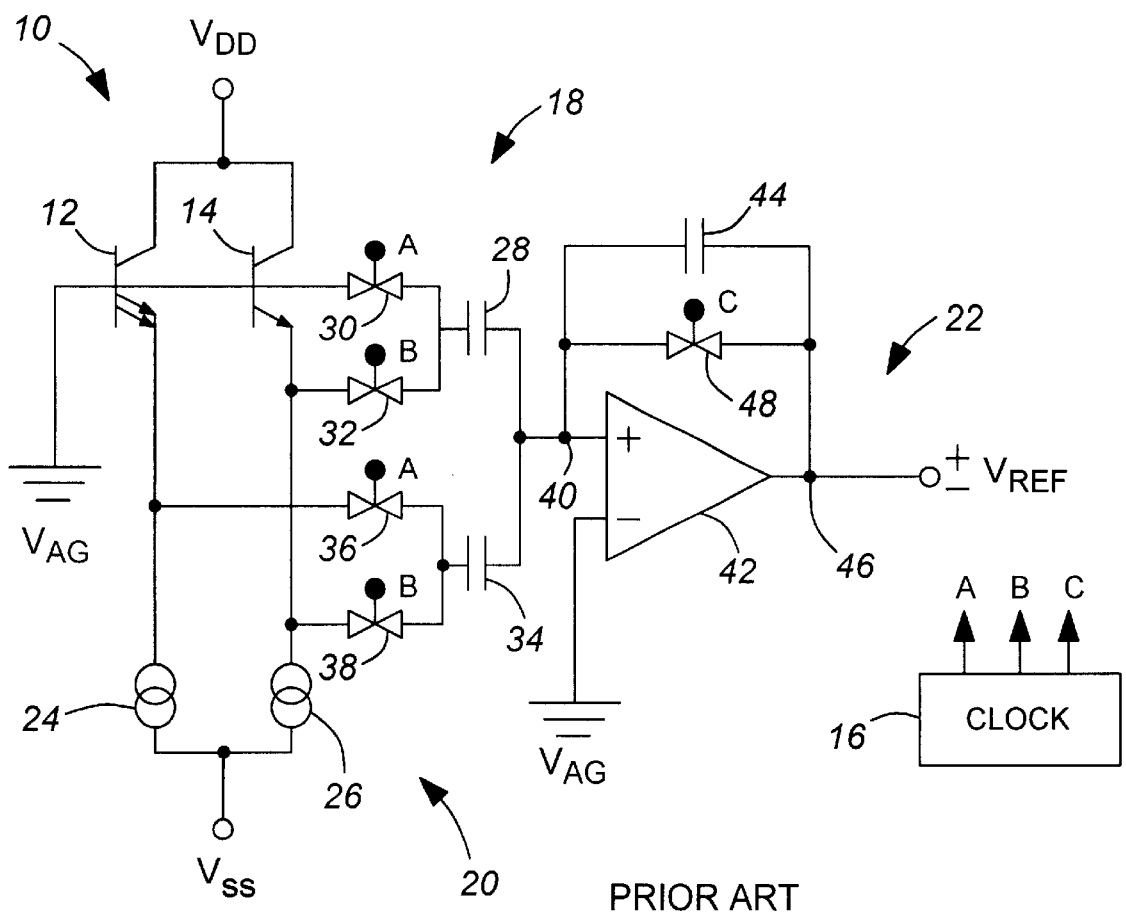
FIG. 2 illustrates a switched capacitor, temperature-independent, bandgap reference utilizing three input clocks.

To overcome the inaccuracies created by the resistor combination, a switched capacitor circuit 10 as shown in FIG. 2 has also been disclosed in the prior art. In this circuit bipolar transistors 12 and 14 are used to obtain the stable bandgap reference voltage. Comparator 42 evaluates the stored voltage across switched capacitors 28 and 34. Clock 16 provides clock signals A, B and C to switches 30, 32, 36, 38 and 48.

Figure 3:
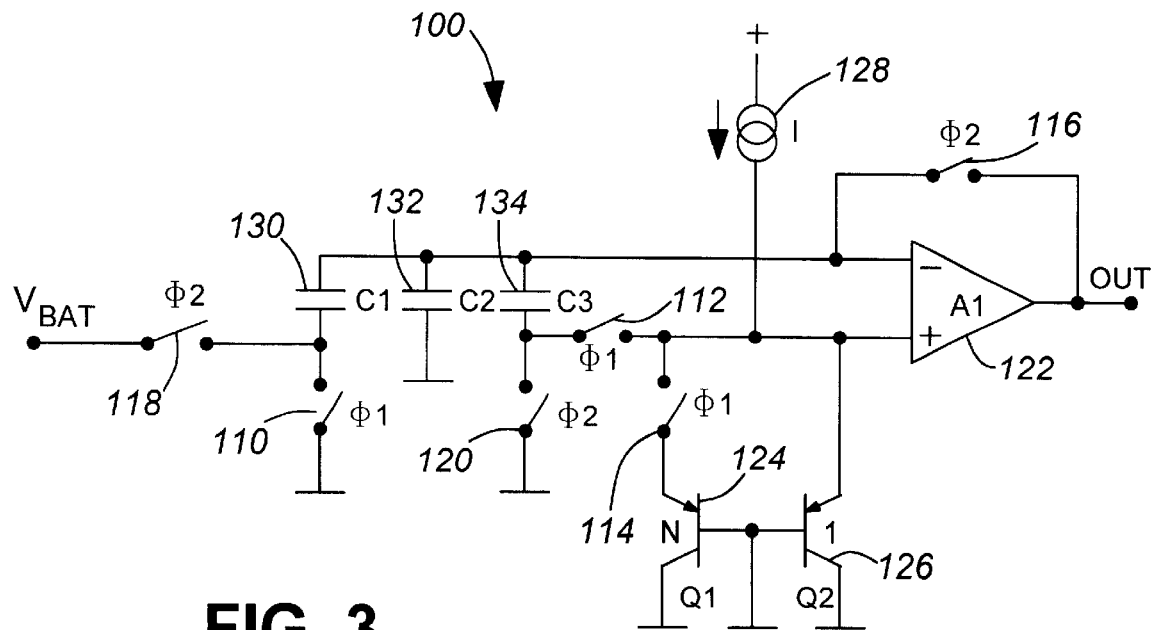
FIG. 3 is a simplified schematic of the low battery voltage detector according to the present invention.

The present invention provides a low voltage monitoring circuit 100 utilizing the switched capacitor arrangement which is illustrated at a high level in FIG. 3. The circuit 100 includes switches 110, 112, 114, 116, 118 and 120, operational amplifier 122 bipolar transistors 124 and 126, current source 128, capacitors 130 (C1), 132 (C2), 134 (C3) and battery voltage input 136.

As mentioned previously, the object of the invention is to compare an appropriately scaled battery voltage to a stable reference voltage. The reference voltage from the bandgap reference is the sum of a $V_{BE}$ with a negative temperature coefficient and a $K_1 \Delta V_{BE}$ with a positive temperature coefficient, were $K_1$ is a scaling factor chosen to balance the negative and positive coefficient and $\Delta V_{BE}$ is the difference in $V_{BE}$ between the two transistors with different current densities. The sum of $V_{BE}$ and $K_1 \Delta V_{BE}$ is equal to the silicon bandgap voltage or approximately 1.2 volts.

In essence, the object of the invention is carried out by determining the sign of the expression $V_{BE}+K_1\Delta V_{BE}-K_2 V_{BAT}$. In evaluating this expression it is possible to see whether $V_{BAT}$ is above or below a minimum voltage V min. The value of the Vmin depends on $K_2$ and is approximately $1.2/K_2$ volts In a switched capacitor circuit, the above mentioned three voltages can be sampled on capacitors C1, C2 and C3 and then summed to get the answer. The size of each capacitor controls the scaling of each voltage and the accuracy of the scaling is normally a magnitude better then if resistors are used. Another inherent advantage of the present invention is that the typical 1.2 volt bandgap reference voltage is actually never created, so in principle the circuit will work for supply voltages below 1.2 volts. Further, there is not a problem in setting Vmin to be less than 1.2 volts.

As discussed previously, a clock signal (not shown in FIG. 3) is required in the implementation of the detector circuit. The clock is required to generate two phases or stages which are shown in FIG. 3 as phase 1 ($\Phi$1) and phase 2 ($\Phi$2). During phase 1 or the pre-charge phase switches 110, 112, 114 and 116 are closed while switches 118 and 120 are open. In phase 2 switches 110, 112, 114 and 116 are open while switches 118 and 120 are closed. All of the above switches are shown in FIG. 1 as generic switches for simplicity while it is known that these switches in a preferred embodiment are actually MOS devices as shown in greater detail in FIG. 5.

In pre-charge phase 1 switch 114 is closed so that current from current source 128 flows through both transistors 124 and 126. Hence both transistors are active and the positive input of operational amplifier 122 will be biased at $V_{BE}$ also known as $V_{BElow}$. Since switch 116 is also closed the negative input of operational amplifier will also be raised to $V_{BElow}$. Since switch 110 and 112 are closed and switch 120 open, capacitor 130 and capacitor 132 will be charged to $V_{BElow}+V_{offset}$ where $V_{offset}$ is the off set voltage in the operational amplifier 122. Capacitor 134 will be charged to $V_{offset}$.

During the second stage or phase 2, switches 110, 112, 114 and 116 are opened while switches 118 and 120 are closed. Now all of the current from source 128 flows through the transistor 126 and this higher current density results in a higher base to emitter voltage across transistor 126. The positive input of operational amplifier 122 is now raised to $V_{BE2}$ or $V_{BEhigh}$. As discussed previously the difference between $V_{BEhigh}$ and $V_{BElow}$ is the $\Delta V_{BE}$ value. It has a value kT/qln (N+1) when N is the relative emitter area of transistor 124.

When the battery voltage $V_{BAT}$ at input 136 is at the threshold or trip point, $V_{min}$ the negative input of operational amplifier 122 will be at a voltage equal to $V_{BEhigh}$ plus $V_{offset}$. Capacitor 130 is charged to $V_{BEhigh}+V_{offset}-V_{BAT}$ while capacitor 132 and capacitor 134 are charged to $V_{BEhigh}+V_{offset}$. The transfer of charges between the capacitors when switching between phase 1 and phase 2 can be written has: $C3V_{BEhigh}+(C1+C2)\Delta V_{BE}-C1V_{BAT}$. It will be recognized that this is similar to the expression previously given as $V_{BE}+K_1\Delta V_{BE}-K_2V_{BAT}$. In this expression the weighting factor $K_1$ will be determined by (C1+C2)/C3 and the factor $K_2$ is given by C1/C3. It is significant that the off set voltage in the operational amplifier 122 will not affect the above result as long as it does not change when the reference voltage at the positive input changes from $V_{BElow}$ to $V_{BEhigh}$ so a small and simple amplifier can be used to save current and area.

Figure 4:
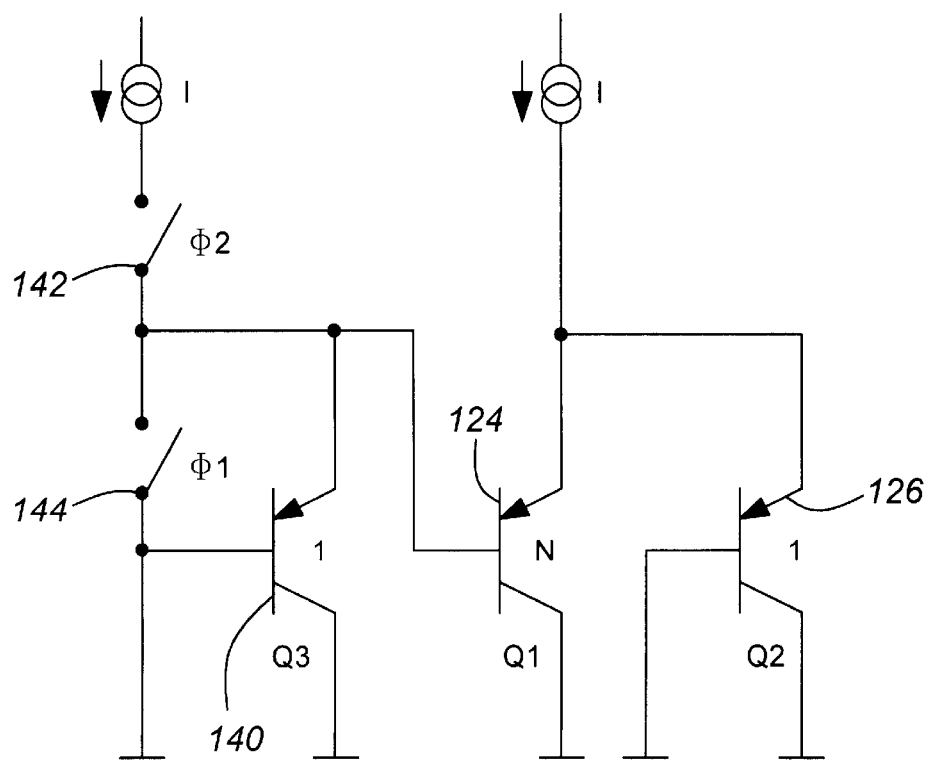
FIG. 4 illustrates a second embodiment of the bandgap reference circuit.

At relatively low operating voltages MOS switches can have a sufficient on resistance especially if they are biased at a voltage between the supply voltages. This is not a problem in a switched capacitor circuit as long as the time constants are much shorter then the clock. But the switch in series with the transistor 124 will have a DC current and this will result in a voltage drop and consequently reduced accuracy. A different topography may therefor be used to switch transistor 124 on and off and this alternate topography is shown in FIG. 4. In this implementation, two current sources are provided and switch 114 is replaced with switches 142 and 144. In phase 1 switch 144 is closed and the switch 142 is open and in phase 2 switch 142 is closed while switch 144 is open. Therefore in phase 1 the base of transistor 124 is shorted to ground and the transistor is active. In phase 2 the base of transistor 124 is biased at $1V_{BE}$ above ground. If the transistors 126 and 140 are matched the value $V_{BE}$ is the same voltage as the emitter voltage at transistor 124 so that $V_{BE}$ is 0 volts and the transistor will be turned off. There is still current flowing through switch 144 to ground during phase 1 but only the base current. With the switch connected to ground the on resistance will also be lower.

Figure 5:
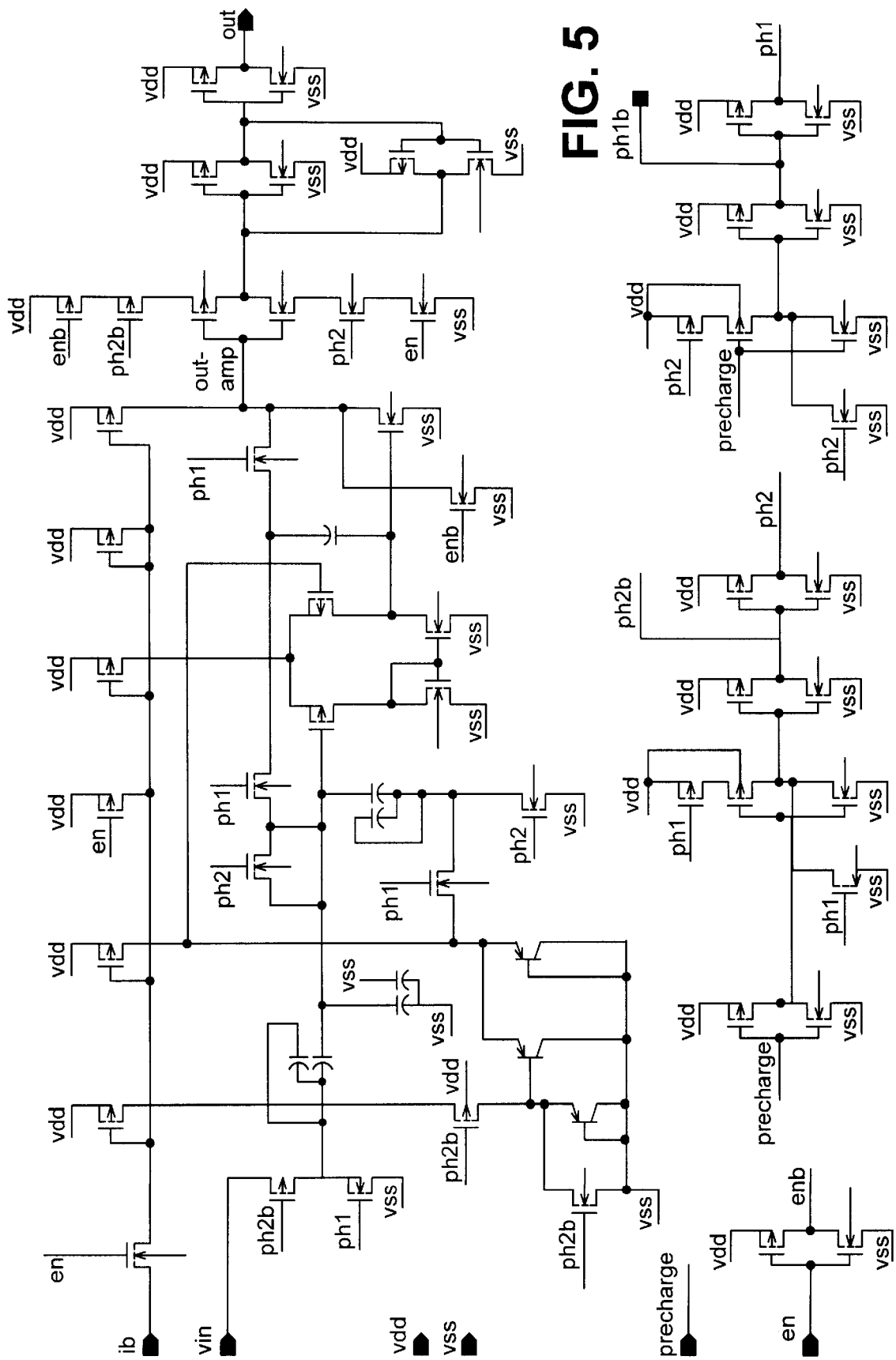
FIG. 5 is a circuit diagram of the CMOS low voltage battery detector according to the present invention.

FIG. 5 is a detailed circuit diagram of the CMOS low voltage detector circuit including the circuit topography of FIG. 4.

Although specific embodiments of the invention have been described and illustrated it will be apparent to one skilled in the art that numerous variations can be made without departing from the basic concept. It is to be understood, however that such variations will fall within the true scope of the invention as defined in the appended claims.

What is claimed is:

1. A detector for providing a low battery voltage indication comprising:
    a stable voltage reference and comparator circuit for comparing the battery voltage and the voltage reference;
    a switch means to switch between a first operational state and a second operational state;
    a switched capacitor circuit to store charges related to the battery voltage and the reference voltage in each operational state; and
    a clock to initiate switching between the first and second states; wherein an output from the comparator during the second state indicates whether the battery voltage is below a preset threshold (Vmin) such that $$Vmin=Vref-K*Vbat$$

where:
    Vref is the reference voltage
    Vbat is the battery voltage; and
    K is a scaling factor.

2. A detector as defined in claim 1 wherein said stable voltage reference is a bandgap reference circuit.

3. A detector as defined in claim 2 wherein said bandgap reference circuit comprises a pair of bipolar transistors supplied with a first current density in said first state and a second greater current density in said second state.

4. A detector as defined in claim 1 wherein said first operational state is a precharge phase and said second operational state is an evaluation phase.

5. A detector as defined in claim 1 fabricated on an integrated circuit (IC) employing CMOS technology.

6. A detector as defined in claim 5 wherein said comparator is an operational amplifier.

7. A detector as defined in claim 6 wherein offset voltages due to first and second inputs to said operational amplifier are cancelled by said switched capacitor circuit.

8. A detector as defined in claim 1 wherein capacitors in said switched capacitor circuit define a weighting factor for establishing said threshold.

9. A detector as defined in claim 1 wherein said bandgap reference circuit comprises three bipolar transistors with a first switchable current source is supplied to one transistor and a second current source is supplied to the other two transistors.

10. A detector for providing a low battery voltage indication comprising:
    a stable voltage reference and comparator circuit for comparing the battery voltage and the voltage reference;
    a switch means to switch between a first operational state and a second operational state;
    a switched capacitor circuit to store charges related to the battery voltage and the reference voltage in each operational state; and
    a clock to initiate switching between the first and second states; wherein an output from the comparator during the second state indicates whether the battery voltage is below a preset threshold (Vmin) set such that:

$$Vmin>VBE+K1\Delta VBE-B2BAT$$

where: Vmin is the threshold value

VBE is the base to emitter voltage across a first transistor of the bandgap reference;

$\Delta VBE$ is the difference between base to emitter voltages in two bandgap transistors having difference current densities;

VBAT is the battery voltage;

K1 is a first scaling factor, and

K2 is a second scaling factor.

11. A detector as defined in claim 10 having three capacitors ($C_1$, $C_2$ and $C_3$) wherein $K_1$ and $K_2$ are determined by said capacitors according to the ratios $K_1 = C_1 + C_2/C_3$ and $K_2 = C_1/C_3$.

12. A method of detecting low battery voltage supplied to an integrated circuit comprising:
    providing a stable voltage reference and comparator circuit for comparing battery voltage against the reference voltage;
    providing a capacitor circuit for storage charges associated with the battery voltage and the reference voltage;
    providing switching means to switch between a first phase wherein said capacitors are charged to a first voltage level and a second phase wherein said capacitors are charged to a second level; and
    comparing said first and second levels to determine whether said battery voltage is above or below a preset threshold (Vmin) such that $$Vmin=Vref-K*Vbat$$

where:
    Vref is the reference voltage
    Vbat is the battery voltage; and
    K is a scaling factor.

13. The method as defined in claim 12 wherein said switching means are MOS devices.

14. The method of claim 12 wherein said stable voltage reference is a bandgap cell having a value of approximately 1.2 volts and Vmin is approximately 1.2/K .

* * * * *